United States Patent
S et al.

(10) Patent No.: US 12,021,517 B2
(45) Date of Patent: Jun. 25, 2024

(54) GATE DRIVER WITH FEED FORWARD CONTROL OF GATE CURRENT

(71) Applicant: TEXAS INSTRUMENTS INCORPORATED, Dallas, TX (US)

(72) Inventors: Sachin S, Bengaluru (IN); Subramanian Narayan, Bengaluru (IN); Krishnamurthy Shankar, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/866,128

(22) Filed: Jul. 15, 2022

(65) Prior Publication Data
US 2024/0022244 A1   Jan. 18, 2024

(51) Int. Cl.
*H03K 17/687* (2006.01)
*H02M 1/08* (2006.01)
*H02P 27/04* (2016.01)

(52) U.S. Cl.
CPC ........... *H03K 17/6871* (2013.01); *H02M 1/08* (2013.01); *H02P 27/04* (2013.01); *H03K 2217/0063* (2013.01); *H03K 2217/0072* (2013.01)

(58) Field of Classification Search
CPC ...... H03K 17/6871; H03K 2217/0072; H02M 1/08; H02P 27/04
See application file for complete search history.

(56) References Cited

U.S. PATENT DOCUMENTS

| | | | | |
|---|---|---|---|---|
| 2003/0184391 A1* | 10/2003 | Sekimoto | ................. | H03K 5/19 331/74 |
| 2006/0068737 A1* | 3/2006 | Koo | ...................... | H03L 7/1976 455/260 |
| 2011/0175650 A1* | 7/2011 | Tumminaro | ......... | H03K 17/163 327/109 |
| 2017/0288653 A1* | 10/2017 | Yokoi | ...................... | H03K 5/08 |

* cited by examiner

*Primary Examiner* — Metasebia T Retebo
(74) *Attorney, Agent, or Firm* — John R. Pessetto; Frank D. Cimino

(57) ABSTRACT

A gate driver includes a gate current circuit and a driver logic circuit. The gate current circuit has a gate current circuit output and includes first and second current sources coupled to the gate current circuit output. The driver logic circuit has a capacitor and is configured to: charge and discharge the capacitor to generate a detect voltage across the capacitor; cause the first current from the first current source to flow to the gate current circuit output in response to a voltage on the gate current circuit output being below the detect voltage; and cause the second current from the second current source to flow to the gate current circuit output in response to the voltage on the gate current circuit output being above the detect voltage.

10 Claims, 5 Drawing Sheets

GATE DRIVER WITH FEED FORWARD
CONTROL OF GATE CURRENT

BACKGROUND

A gate driver is a circuit that turns ON a transistor in response to a digital control signal. For example, an n-channel field effect transistor (NFET) is turned ON in response to a gate driver forcing current into the gate of the NFET. As current flows into the NFET's gate, the voltage on the gate increases. To sufficiently turn on the NFET to be able to accommodate a target amount of drain current requires the gate-to-source voltage (Vgs) of the NFET reaching a voltage level corresponding to the target drain current—a higher level of drain current requires the Vgs of the NFET to be larger than for a lower level of drain current. It takes a finite amount of time for the Vgs of the NFET to reach a sufficient level for the corresponding level of drain current. For the same amount of gate current to turn ON an NFET, turning ON an NFET to a higher drain current takes longer than turning on the same NFET to a lower drain current.

SUMMARY

In one example, a gate driver includes a gate current circuit and a driver logic circuit. The gate current circuit has a gate current circuit output and includes first and second current sources coupled to the gate current circuit output. The driver logic circuit has a capacitor and is configured to: charge and discharge the capacitor to generate a detect voltage across the capacitor; cause the first current from the first current source to flow to the gate current circuit output in response to a voltage on the gate current circuit output being below the detect voltage; and cause the second current from the second current source to flow to the gate current circuit output in response to the voltage on the gate current circuit output being above the detect voltage.

DETAILED DESCRIPTION

Figure 1:
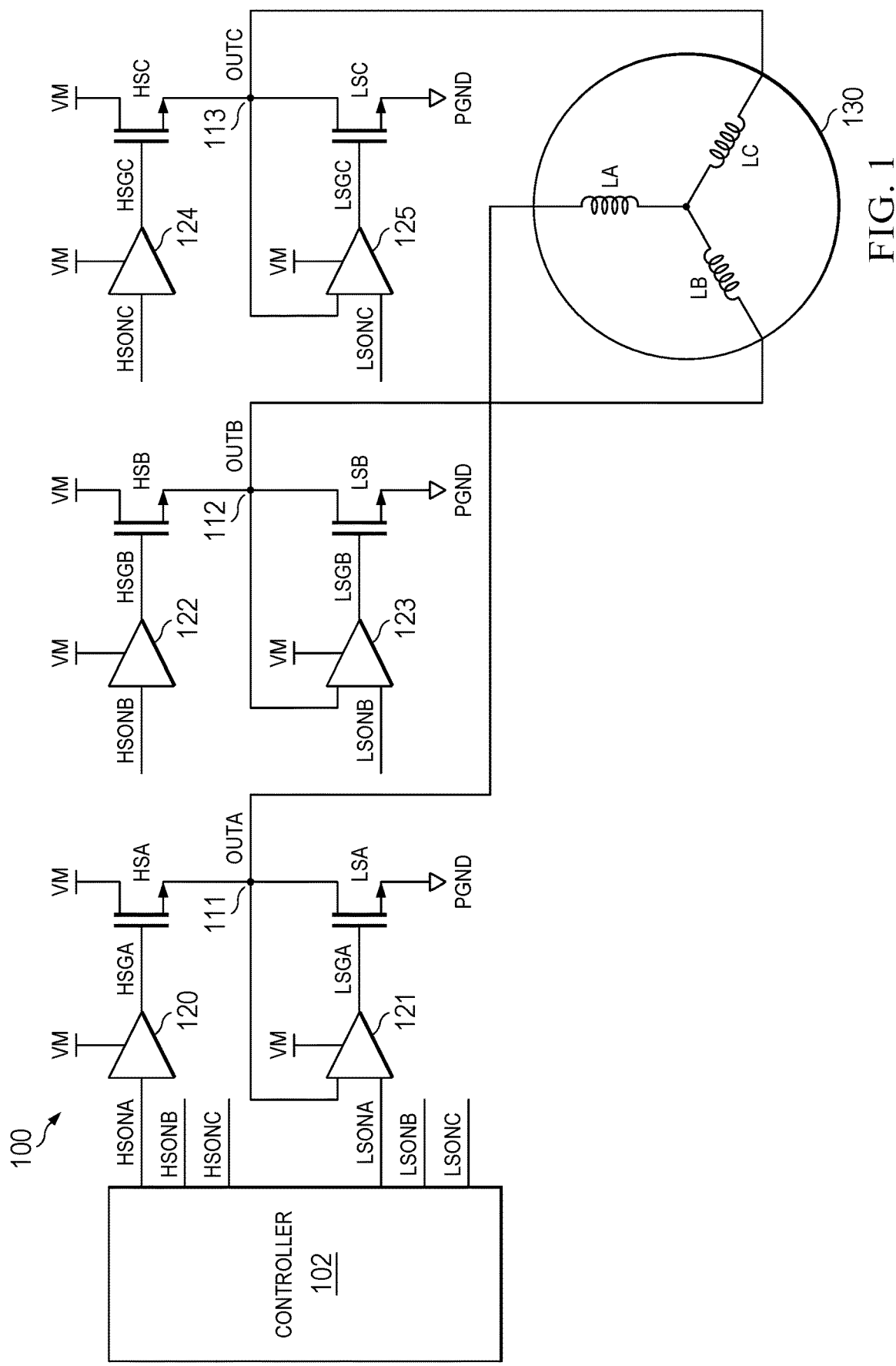
FIG. 1 is a schematic diagram of a motor control system, in accordance with an example.

The same reference numbers or other reference designators are used in the drawings to designate the same or similar (either by function and/or structure) features.

In some examples, a gate driver may be coupled to a controller to receive control signals to drive one or more transistors. The transistors may be configured as transistor pairs where one transistor is a high-side transistor and the other is a low-side transistor. Each transistor pair may be configured to supply power to one or more windings of a motor (such as a three-phase motor, e.g., a brush-less motor).

The gate drivers described herein may be used in, for example, motor controllers and switching voltage regulators. The gate driver described herein may also (or alternatively) utilized in a voltage regulator or other power management system.

FIG. 1 is a schematic diagram of a control system 100 for a motor 130, in accordance with an embodiment. In this example, the motor 130 is a three-phase motor. As a three-phase motor 130, the motor includes windings LA, LB, and LC (A, B, and C referring to each of the three phases). A high side/low side pair of transistors is coupled to each of the three phases A, B, and C. High side (HS) transistor HSA is coupled to low side (LS) transistor LSA between a voltage supply VM and ground (PGND). Similarly, high side transistor HSB is coupled to low side transistor LSB between VM and PGND, and high side transistor HSC is coupled to low side transistor LSC also between VM and PGND. All six of the transistors in this example are n-channel field effect transistors (NFETs) but can be implemented as other types of transistors in other examples. For example, the high side transistors can be implemented as p-channel field effect transistors (PFETs) in some embodiments.

The source of the high side transistor HSA is coupled to the drain of the low side transistor LSA at a node 111 that couples to phase A of the motor (e.g., to one end of winding LA as shown). The voltage on node 111 is labeled OUTA and is the voltage provided to the winding LA of phase A of the motor. When transistor HSA is ON, OUTA is pulled to a voltage approximately equal to VM. After transistor HSA is turned OFF and before transistor LSA turns ON (i.e., during a "dead time" when neither transistor is ON), OUTA is pulled to an even higher voltage which is approximately equal to VM plus the voltage drop across the body diode transistor HSA (described below with reference to FIG. 2). When transistor LSA is ON, OUTA is pulled to approximately PGND. Node 111 is also referred to as a switch node, and voltage OUTA is a switching voltage waveform. High side/low side transistor pair HSB/LSB also has a switch node 112 between the transistors, and the voltage thereon is labeled OUTB which is coupled to winding LB of the motor. Similarly, switch node 113 between transistor pair HSC/LSC has a voltage labeled OUTC and is coupled to winding LC of the motor, as shown.

The motor control system of FIG. 1 also includes a controller 102 (which may include, for example, a processor, digital circuitry, analog circuitry, memory, analog-to-digital converter (ADC), digital-to-analog converter (DAC), software and/or any combination thereof). Controller 102 generates digital control signals to drive the respective transistors via one or more gate drivers. Control signal HSONA controls the ON/OFF state of transistor HSA. Control signal HSONB controls the ON/OFF state of transistor HSB. Control signal HSONC controls the ON/OFF state of transistor HSC. Control signal LSONA controls the ON/OFF state of transistor LSA. Control signal LSONB controls the ON/OFF state of transistor LSB. Control signal LSONC controls the ON/OFF state of transistor LSC. Each transistor is coupled to a gate driver which receives the corresponding digital control signal as an input. The output of the driver is coupled to the gate of the corresponding transistor. The gate drivers for the high side transistors HSA, HSB, and HSC include gate drivers 120, 122, and 124, respectively. The gate drivers for the low side transistors LSA, LSB, and LSC include gate drivers 121, 123, and 125, respectively.

The motor 130 operates from an alternating current (AC) voltage/current that has a frequency of, for example, 50 Hz or 60 Hz. The controller 102 operates from a clock (which may be supplied from an external source or generated by controller 102) that has a substantially higher frequency (e.g., 100 KHz, 500 KHz, etc.) and generates the control signals HSONA, HSONB, etc. at that higher frequency. The switching waveform on each switch node 111, 112, and 113 has a frequency that is substantially higher than the 50 or 60 Hz waveform needed for the motor's operation. The average voltage on each switch node 111-113 can be controlled by the controller 102 adjusting the duty cycle of the switching waveforms. For example, controller 102 may supply control signals such that each winding of motor 130 is driven by a pulse-width modulated (PWM) signal, a pulse-frequency modulated (PFM) signal, a sinusoidal signal, etc. The controller 102 asserts the control signals to the transistors while sinusoidally varying the duty cycle of the switching waveform consistent with a 50 Hz or 60 Hz AC current/voltage.

The embodiments described herein are directed to the low side gate drivers (e.g., gate drivers 121, 123, and/or 125). The described embodiments are directed to gate drivers that are able to turn ON the corresponding transistor with relatively little delay despite the possibility for wide variations in drain current to/from the corresponding phase of the motor. A potential problem addressed by the described embodiments is illustrated in FIGS. 2 and 3, described below.

Figure 2:
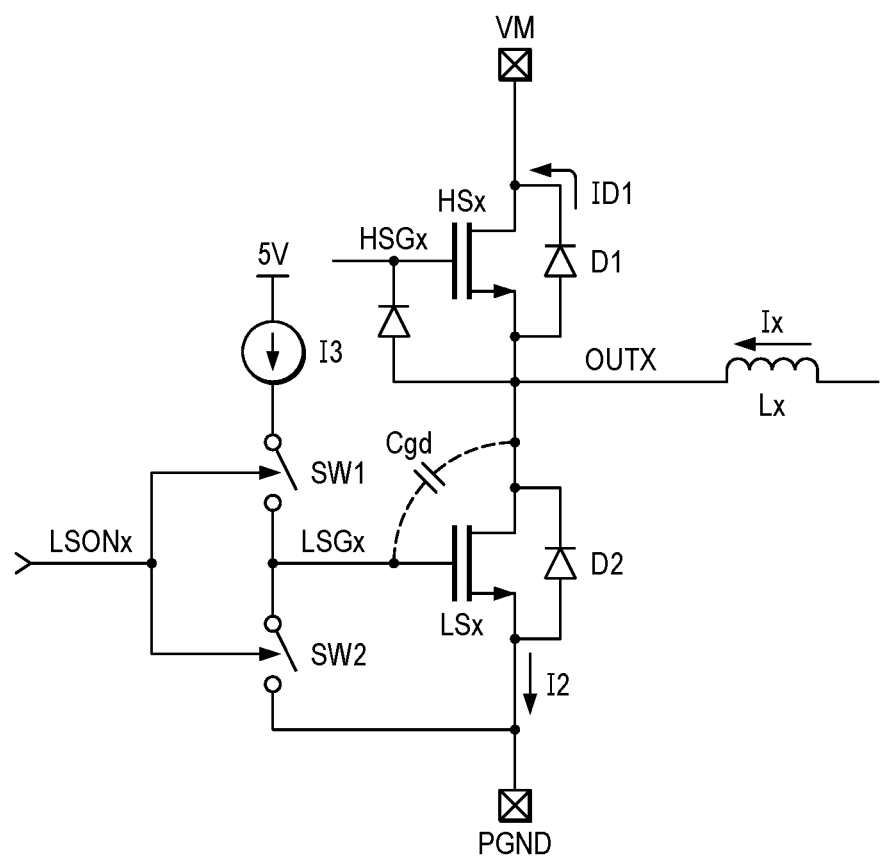
FIG. 2 is a schematic of high side/low side transistor pair for controlling a phase of a motor, in accordance with an example.

FIG. 2 is a schematic of one of the high side/low side pairs of transistors. The high side transistor is transistor HSx (the "x" refers to A, B, or C). The low side transistor is LSx. Diode D1 is the body diode of the high side transistor HSx, and diode D2 is the body diode of the low side transistor LSx. The gate of low side transistor LSx is coupled to a current source I3 through switch SW1 and to PGND through switch SW2. Control signal LSONx controls the ON/OFF (e.g., conducting/non-conducting) states of the switches. While not shown in FIG. 2, either an inverter is inserted between the controller 102 (which supplies the LSONx signal) and the control terminal of SW2 or switches SW1 and SW2 are implemented using transistors of different conductivity types (e.g., SW1 may be implemented with an NFET and SW2 may be implemented with a PFET) so that switches SW1 and SW2 are not ON at the same time. For example, in response to LSONx being logic high, switch SW1 closes and current from current source I3 flows into the gate of transistor LSx to turn ON the transistor. In response to LSONx being logic low, switch SW2 closes and the gate of transistor LSx discharges to ground thereby turning OFF the transistor. An inverter may be included to invert LSONx to control switch SW1 such that SW1 and SW2 are not both ON at the same time. The current from current source I3 is also referred to as I3 ("I3" refers both to the current source (circuit) as well as to the magnitude of the current it produces). The current through winding Lx is labeled Ix. Current source I3 is configurable to produce current at multiple levels, as described below.

Figure 3:
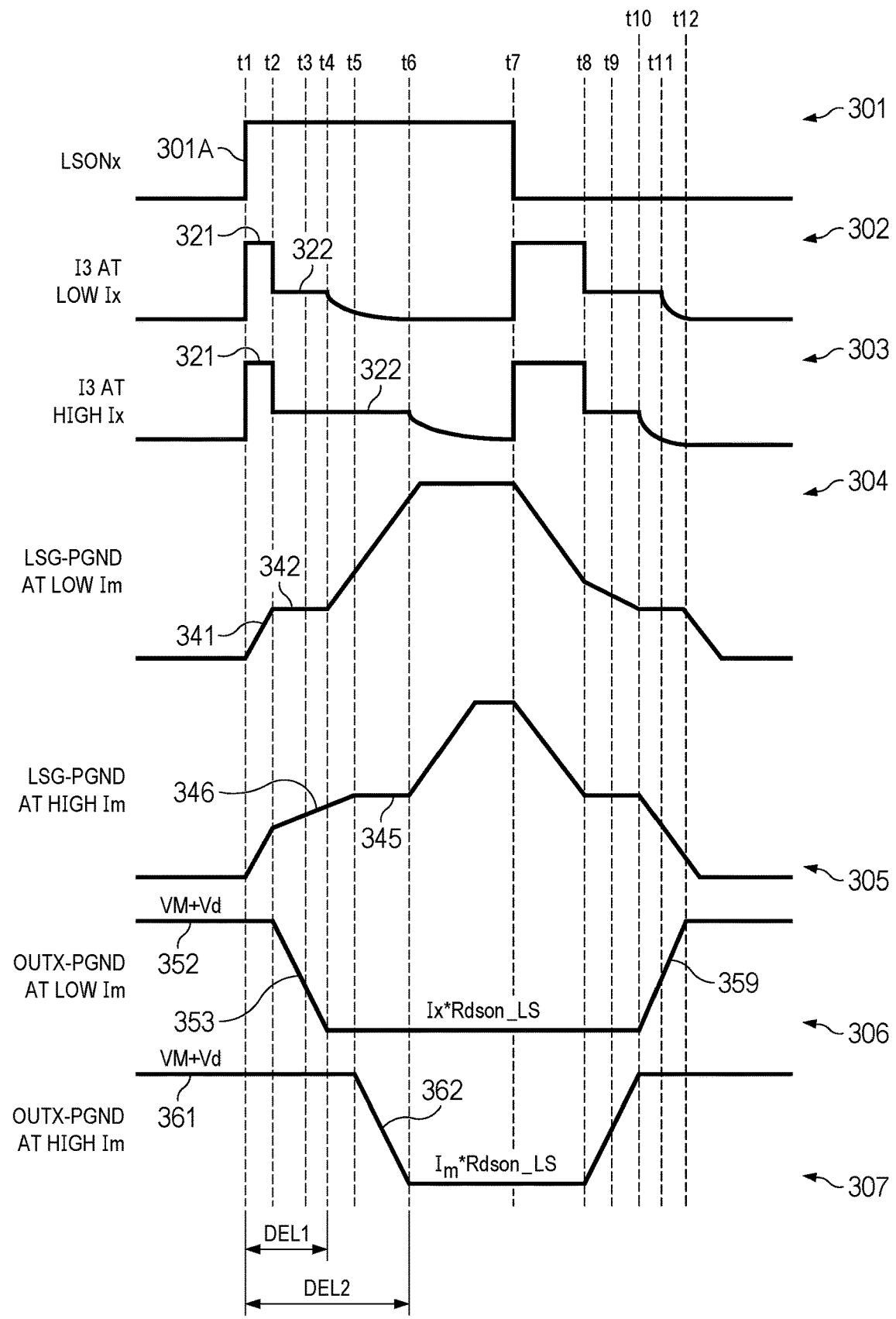
FIG. 3 includes waveforms versus time related to turning ON the low side transistor for different levels of motor current, in accordance with an example.

The waveforms 301-307 in FIG. 3 illustrate a conventional technique for turning ON and OFF the low side transistor LSx. The x-axis in FIG. 3 represents time and the y-axis represents magnitude (e.g., voltage or current) of each signal. Waveform 301 is an example of LSONx. When LSONx is logic low, transistor LSx is OFF. In response to LSONx becoming logic high (e.g., a voltage greater than the threshold voltage for transistor LSx—such as around 1.8 volts, 3.3 volts or 5 volts), transistor LSx begins to turn ON and remains ON while LSONx remains logic high.

Waveforms 302-307 illustrate two different levels of winding current Ix (also referred to as the "load" or "motor" current). Load current Ix is the motor's current for the corresponding phase. When transistor LSx is to be turned ON, the transistor is turned ON to a state where the load current Ix can flow through the transistor. The load current Ix may be different for different motors or may be different for different speeds of operation of the same motor. Accordingly, the low side transistor LSx should be able to turn ON and accept a wide range of drain current. Waveforms 302, 304, and 306 pertain to a lower level of load current Ix, and waveforms 303, 305, and 307 pertain to a higher level of load current Ix.

Waveform 302 is an example of current I3 (the current into the gate of transistor LSx when switch SW1 is closed). Waveform 303 also is an example of current I3. Waveform 302 is for a load current Ix that is lower than the load current for waveform 303. Waveform 304 is an example of voltage LSG-PGND, which is the Vgs of transistor LSx, for the lower load current Ix example (illustrated by waveform 302), and waveform 305 is (LSG−PGND) for the higher load current Ix example (illustrated by waveform 303). Waveform 306 is an example of voltage OUTX−PGND (the switch node voltage relative to ground) for the lower load current Ix example (illustrated by waveform 302), and waveform 307 is OUTX−PGND for the higher load current Ix example (illustrated by waveform 303).

With LSONx at its logic low level (e.g., a voltage that is less than the threshold voltage for transistor LSx—such as around ground, 0 volts), the LSx transistor is OFF, but the controller 102 may have turned ON the corresponding high side transistor HSx, which pulls OUTX up to approximately VM. The controller 102 implements a dead time between turning OFF the HSx transistor and before turning ON the LSx transistor. Upon the controller 102 turning OFF transistor HSx, during the dead time, neither transistor is ON, but the load current IX continues to flow (e.g., due to the rotor of motor 130 continuing to spin thereby causing a current to flow) through the high side transistor's body diode D1 as current ID1. During this dead time, the OUTX voltage is the sum of VM and the diode voltage of diode D1 (Vd).

Starting with the lower load current example (waveforms 302 304, and 306), the current source I3 initially is configured to supply a current at a relatively high level (reference numeral 321). This higher current level 321 occurs from time t1 to time t2. Time t1 is the beginning of the turn-ON process for transistor LSx and coincides with the rising edge 301A of LSON (at which time switch SW1 is closed and switch SW2 is open). As current I3 flows into the gate of the transistor LSx, the gate voltage of transistor LSx begins to increase as indicated at 341. However, until the Vgs of transistor LSx reaches the threshold voltage for the transistor, no current (I2 in FIG. 2) can flow through transistor LSx. Instead, most or all of the motor current Ix flows through the body diode D1 of the high side transistor HSx. Current through the body diode D1 is labeled ID1 in FIG. 2.

Upon the gate voltage (LSG-PGND) reaching the transistor's threshold voltage, a second path for a portion of the load current Ix is present through the low side transistor LSx. As the channel within the low side transistor LSx begins to open, current ID1 through the body diode D1 of the high side transistor HSx begins to decrease and the drain current I2 through the low side transistor LSx begins to increase.

In some control techniques, in response to the gate voltage (LSG-PGND) reaching the low side transistor's threshold voltage, current source I3 is configured to decrease the current into the gate of transistor LSx to a level indicated by reference numeral 322. The lower level of load current Ix in the example of waveforms 302, 304, and 306 is low enough that the Miller voltage is approximately equal to the transistor's threshold voltage. The Miller voltage is the Vgs of the transistor for which the transistor is able to flow the full target current from the motor (approximately 100% of load current Ix).

When the transistor's Vgs reaches the Miller voltage, which occurs in the example of waveforms 302, 304, and 306 at the threshold voltage of the transistor, the parasitic gate-to-drain capacitance (Cgd) of the transistor is able to discharge. While the Cgd of the low side transistor LSx is discharging, some or all of current I3 flows to the parasitic capacitance instead of into the gate of transistor. Because of the diversion of gate current for the discharge process of the transistor's Cgd, the gate voltage of the transistor remains relatively flat as shown at 342 in FIG. 3. This flat part of the (LSG-PGND) waveform may be referred to as the Miller region. The gate current for the low side transistor LSx remains at the lower level 322 until the end of the Miller region coincident with time t4 in this example. While Cgd discharges, the OUTX voltage rapidly falls as indicated by reference numeral 353 from (VM+Vd) towards a relatively low value, which is the product of Ix and the on-resistance of the low side transistor LSx (Ix*Rdson_LS). The subsequent rising edge 359 of (OUTX−PGND) is caused by the controller 102 turning on the high side transistor HSx.

In the example of the waveforms 303, 305, 307, the turn-ON process is largely the same as that described above, but for a higher level of load current Ix. The load current Ix is high enough in this latter example that the Miller voltage is larger than the transistor's threshold voltage. At waveform 303, the initial gate current I3 has the same magnitude 321 as that described above to cause the Vgs to rise up to the level of the threshold voltage. In the control technique illustrated in FIG. 3, the current source current I3 then is caused to decrease to the same lower level 322 as before for the lower drain current example and remains at the lower level until the end of the Miller region (time t6). The Miller voltage in this example is indicated by reference numeral 345, which is higher than the threshold voltage at 346.

Between times t2 (at which the Vgs of the low side transistor has reached its threshold voltage and starts to accept some of the motor current Ix) and t5 (beginning of the Miller region), the (LSG-PGND) of the transistor increases at a lower rate because current I3 into the transistor's gate is smaller (322) than before the threshold voltage was reached (current level 321). During this part of the turn-ON process, the Vgs of the transistor has not yet reached the Miller voltage for the given higher motor current Ix and thus the transistor is not able to conduct all of the motor current Ix thereby preventing (OUTX-PGND) from falling, as indicated at 361. The subsequent rapid decrease in (OUTX-PGND) identified at 362 occurs when the Vgs of the transistor (LSG-PGND) reaches the Miller voltage.

As described above, the Miller voltage is the Vgs for the transistor to have a drain current equal to the full level of the load current Ix. Higher load (drain) currents require higher levels of a transistor's Vgs. The conventional control technique described above causes the gate current (I3) to the transistor to decrease from a higher level 321 to a lower level 322 in response to the Vgs reaching the transistor's threshold voltage. However, the Miller voltage (which is function of load current) may be larger than the threshold voltage, and maintaining the gate current at the lower level 322 as the transistor's Vgs progresses upward towards the Miller voltage causes a delay between the rising edge 301A of LSON (which signals when the transistor LSx is to be turned ON) and the time at which the switch node voltage, OUTX, actually falls. The delay for the lower motor current case is designated as DEL1 on waveform 306 and DEL2 on waveform 307. As can be observed, DEL2 (for a higher motor current) is larger than DEL1 (for a lower motor current). The gate driver for the low side transistors described below reduces the turn-ON delay for higher levels of motor current.

In accordance with an embodiment, a gate driver turns ON the corresponding low side transistor by initially providing a higher level of gate current followed by a lower level of gate current. The point at which the gate driver switches from the higher level of gate current to the lower level of gate current approximately coincides with the beginning of the Miller region, at which the full load current begins to flow through the low side transistor and OUTX rapidly falls. Accordingly, the time duration during which the gate driver provides the higher level of gate current is a function of the load current. This time duration is higher for a higher level of gate current and lower for a lower level of gate current. By dynamically varying the length of time for the initial higher level of gate current, the time delay between a rising edge of LSON to the rapidly falling OUTx switch node voltage is reduced, particularly for higher levels of load current.

Figure 4:
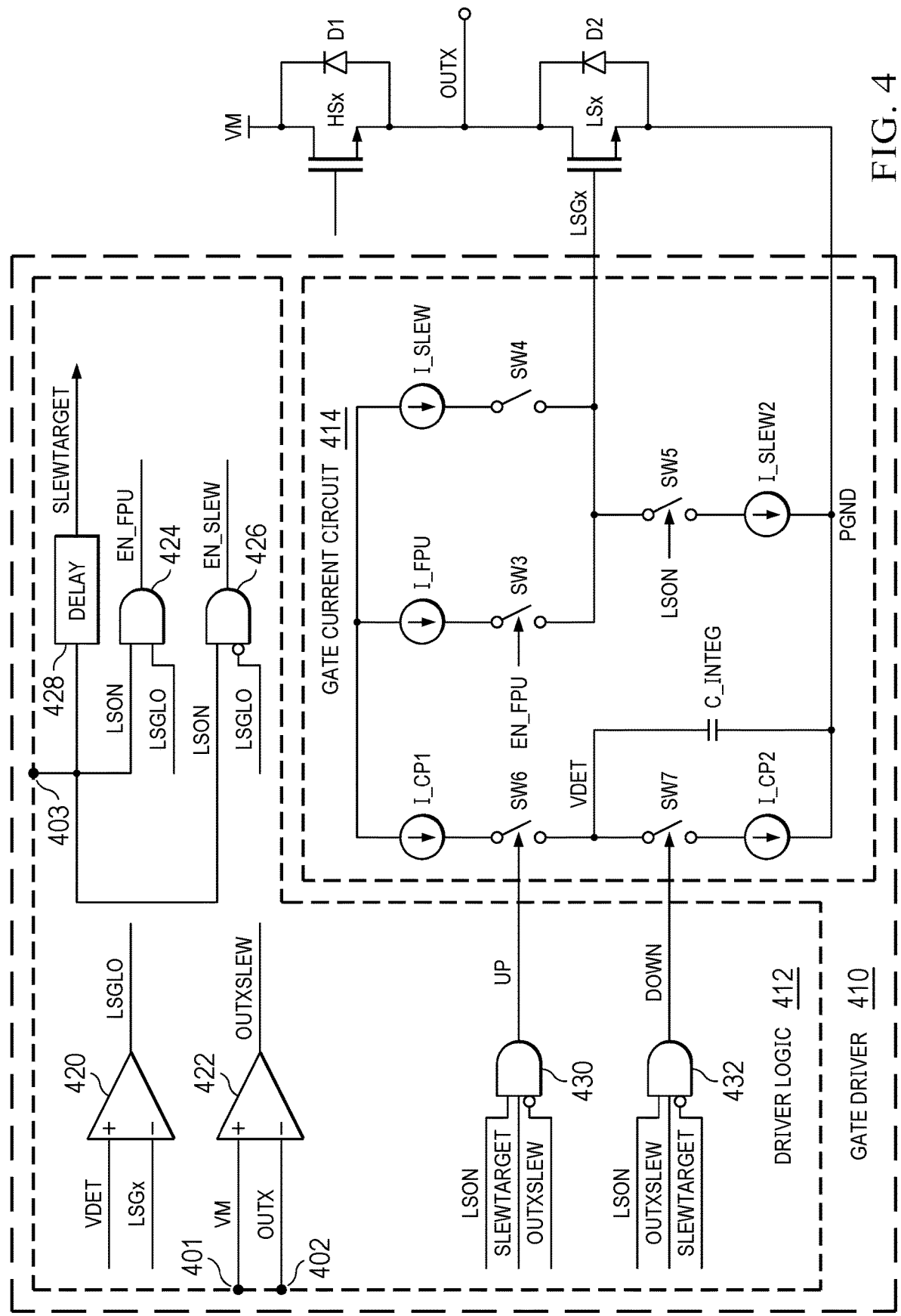
FIG. 4 is a schematic of a gate driver for a low side transistor, in accordance with an example.

FIG. 4 is a schematic of an example gate driver 410 which extends the time during which the gate driver provides the initial higher level of gate current until the Miller voltage is reached. Any or all of gate drivers 121, 123, and 125 can be implemented using the example gate driver 410 of FIG. 4. In this example, gate driver 410 includes a driver logic circuit 412 coupled to a gate current circuit 414.

The driver logic circuit 412 includes analog comparators 420 and 422, logic gates 424, 426, 430, and 432, and a delay 428. In this example, logic gates 424, 426, 430, and 432 are AND gates. The driver logic circuit 412 includes inputs 401, 402, and 403. Input 401 is coupled to the voltage supply VM. Input 402 is coupled to OUTx. The LSON control signal is provided to input 403, which also is coupled to an input of each of AND gates 424, 426, 430, and 432 as shown. AND gates 424, 426, 430, and 432 include LSON as an input signal to cause the gate driver 410 to only turn ON the low side transistor LSx when LSON is logic high.

The gate current circuit 414 includes current sources I_FPU, I_SLEW1, I_SLEW2, I_CP1, and I_CP2, switches SW3, SW4, SW5, SW6, and SW7, and capacitor C_INTEG. The higher gate current described above is I_FPU and the lower gate current is I_SLEW1. Higher gate current I_FPU flows to the gate of transistor LSx in response to switch SW3 being closed. The control signal for switch SW3 is EN_FPU and is the output signal of AND gate 424. Lower gate current I_SLEW1 flows to the gate of transistor LSx in response to switch SW4 being closed. The control signal for switch SW4 is EN_SLEW and is the output signal of AND gate 426. One input of each of AND gates 424 and 426 is LSON, and the other input receives an internally generated signal LSGLO (output signal from comparator 420), with the LSGLO signal being inverted for AND gate 426 but not being inverted for AND gate 424. Because LSGLO is inverted for AND gate 426 but not for AND gate 424, only one of output signals EN_FPU and EN_SLEW is at a high logic level at any point in time. Accordingly, in this embodiment the current from only one of the current sources I_FPU and I_SLEW is provided to the gate of transistor LSx. To turn OFF transistor LSx, switch SW5 is closed (in response to LSON being logic low) thereby causing the gate of transistor LSx to discharge through current source I_SLEW2 to PGND.

Capacitor C_INTEG is charged responsive to switch SW6 being closed and is discharged responsive to switch SW7 being closed. The control signal for switch SW6 is the UP signal from AND gate 430, and the control signal for switch SW7 is the DOWN signal from AND gate 432. Only one of the UP or DOWN signals is active high at any point in time, and thus only one of switches SW6 or SW7 is closed at any point in time.

The voltage that develops across capacitor C_INTEG is VDET and is provided to the positive (+, non-inverting) input of analog comparator 420. As will be described below, capacitor C_INTEG is charged in such a way that its voltage, VDET, is approximately equal to the Miller voltage for the transistor LSx to accept the full load current. The voltage on the gate of the low side transistor LSx (LSGx) is coupled to the negative (−, inverting) input of comparator 420. The comparator 420 asserts output signal LSGLO logic high responsive to VDET being greater than LSGx (which is the case while the gate voltage is below the Miller voltage) and asserts output signal LSGLO logic low responsive to VDET being less than LSGx (which is the case when the gate voltage reaches and exceeds the Miller voltage). AND gate 426 asserts EN_SLEW logic high responsive to LSGLO being logic low (before the gate voltage has reached the Miller voltage), and LSON being asserted logic high. AND gate 424 asserts EN_FPU logic high responsive to LSGLO being logic high (after the gate voltage reaches the Miller voltage) and LSON being asserted a logic high.

During the initial phase of turning ON the transistor LSx (before the Miller voltage is reached), comparator 420 forces LSGLO to a logic high state (e.g., due to VDET being greater than LSGx), which causes AND gate 424 to force EN_FPU to a logic high level, thereby causing switch SW3 (while AND gate 426 forces EN_SLEW logic low which opens switch SW4) to close and causing the higher current level of current source I_FPU to flow into the gate of transistor LSx. Upon the gate voltage reaching the Miller voltage, comparator 420 forces LSGLO to a logic low level, which causes AND gate 426 to assert EN_SLEW to a logic high level thereby closing switch SW4, while AND gate 424 forces EN_FPU to a logic low level thereby opening switch SW6. With switch SW4 closed the lower current level of current source I_SLEW flows into the gate of the transistor LSx.

As described above, VDET is generated by partially charging capacitor C_INTEG in response to a positive assertion (e.g., causing to be at a logic high level) of the UP output signal from AND gate 430 and partially discharging the capacitor in response to a positive assertion of the DOWN output signal from AND gate 432. AND gate 430 includes one input that receives LSON, another input that receives SLEWTARGET, and another input that receives the inverse of OUTXSLEW (OUTXSLEW is inverted into or by AND gate 430). AND gate 432 includes one input that receives LSON, another input that receives OUTXSLEW (not inverted), and another input that receives the inverse of SLEWTARGET (SLEWTARGET is inverted into or by AND gate 432). OUTXSLEW is the output signal from comparator 422.

The positive input of comparator 422 is coupled to input 401 and receives the voltage supply VM. The negative input of comparator 422 is coupled to input 402 and receives OUTX. Comparator 422 compares analog voltages VM and OUT and asserts OUTXSLEW to a logic high level responsive to VM being greater than OUTX, and forces OUTXSLEW to a logic low level responsive to VM being less than OUTX. As described above, during the dead time (neither transistor HSx nor LSx is ON), OUTX is (VM+Vd) and thus is higher than VM. Upon the gate voltage of transistor LSx reaching the Miller voltage, the full load current begins to flow through transistor LSx and OUTx falls rapidly thereby resulting in OUTX being smaller than VM. Accordingly, OUTXLSEW changes from logic high to logic low when OUTX begins rapidly falling.

Delay 428 has an input coupled to LSON and generates a delayed version of LSON as its output signal SLEWTARGET. The time value configured into delay 428 is set to a target time following the rising edge of LSON at which time transistor LSx should be fully ON with a drain current equal to the full level of the load current Ix. The amount of the delay time is large enough to provide sufficient time for the gate of transistor LSx to charge to the Miller voltage with enough margin to accommodate the reverse recovery time, yet not so high as to result in significant deadtime losses. During the deadtime, the body diode may be conducting resulting in power dissipation (losses), hence reducing the deadtime is desirable to reduce the deadtime losses.

AND gate 430 asserts UP to a logic high level to close switch SW6 and charge capacitor C_INTEG in response to OUTXSLEW still being logic low when SLEWTARGET is asserted logic high. Accordingly, capacitor C_INTEG is partially charged responsive to the drain current of the LSx transistor still not being approximately equal to (or greater than) the full level of the load current at the time that the transistor should be fully ON. AND gate 432 asserts DOWN logic high to close switch SW7 and partially discharge capacitor C_INTEG in response to OUTXSLEW being logic high, when SLEWTARGET is logic low. Accordingly, capacitor C_INTEG is partially discharged responsive to the drain current of the LSx transistor being approximately equal to (or greater than) the full level of the load current before the target slew time. Having the low side transistor turn ON too quickly (before the target slew time set by delay 428) is disadvantageous due to the reverse recovery of the body diode which otherwise would cause peaking in the current through the FET resulting in a relatively high voltage drop on the conductor (e.g., bondwire) parasitic inductance (the voltage is the parasitic inductance times the rate of change of current with respect to time) resulting in ground bounce. Additionally, the slew rate also becomes higher as the diode comes out of reverse recovery.

When the slew of OUTX (decrease in OUTX) is delayed compared to SLEWTARGET, the AND gate 430 asserts UP to a logic high level, thereby charging capacitor C_INTEG to raise the VDET voltage, which reduces the delay in OUTX slewing. Similarly, when the OUTX slew is faster compared to SLEWTARGET (occurs before assertion of SLEWTARGET), AND gate 432 asserts DOWN logic high, which causes capacitor C_INTEG to partially discharge thereby reducing the VDET voltage. As a result, the delay of the slew of OUTX increases. In operation, the VDET voltage settles to a value at which the OUTX slew delay is approximately equal to the SLEWTARGET delay (that is, OUTX decreases at about the same time that SLEWTARGET is asserted logic high by delay 428). To ensure a consistent OUTX delay, VDET settles to a higher voltage for higher currents and to a lower voltage for lower currents. The delay implemented by the delay 428 is high enough to ensure that this level is below the Miller voltage and does not impact the slew rate even for high levels of I_FPU.

Figure 5:
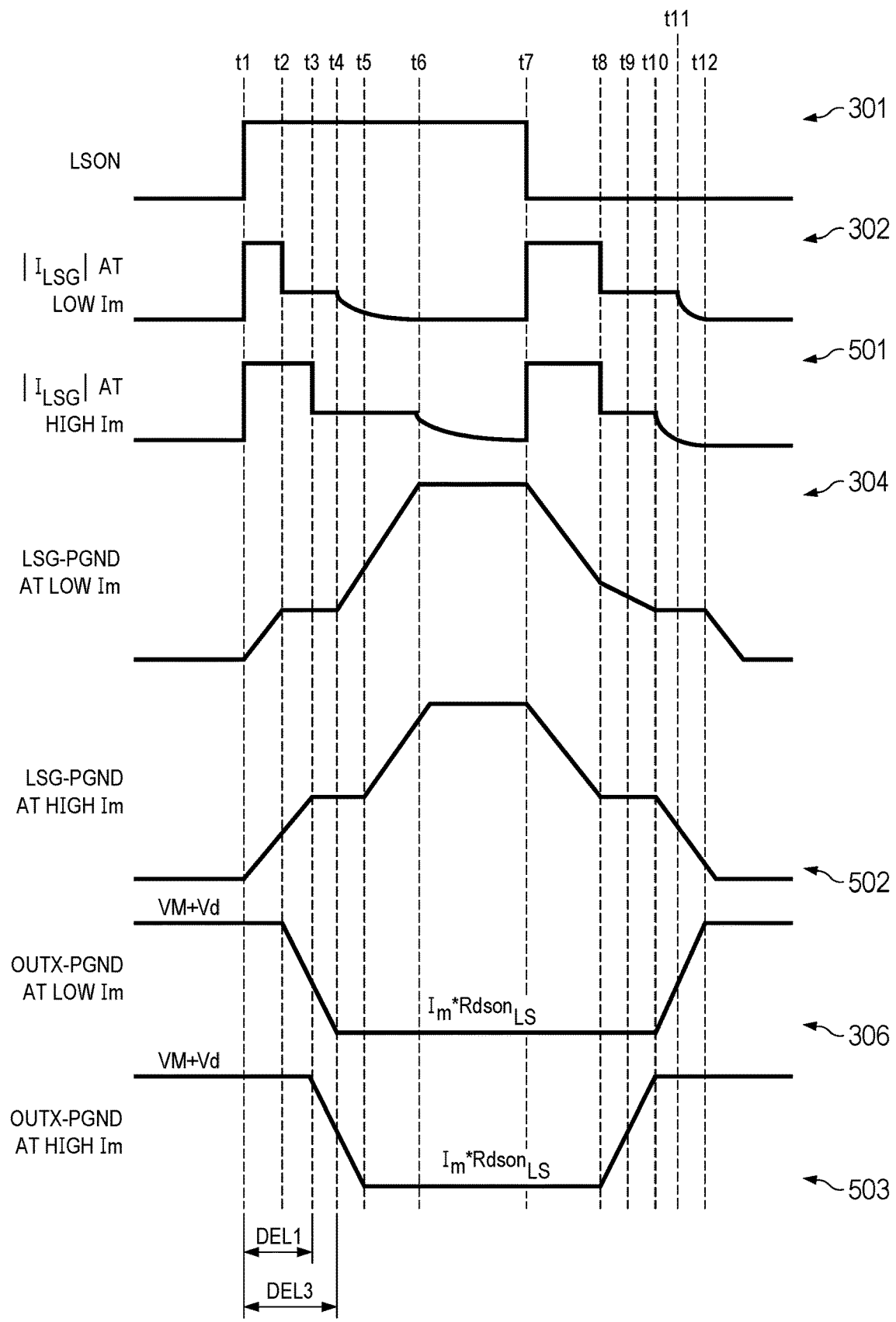
FIG. 5 includes waveforms versus time related to turning ON the low side transistor for different levels of motor current while reducing the turn-ON delay at higher levels of motor current, in accordance with an example.

FIG. 5 repeats waveforms 302, 304, and 306 from FIG. 3 (due to the circuitry of FIG. 4 performing similar to the circuitry of FIG. 2 in the lower current conditions), and includes new waveforms 501, 502, and 503 corresponding to turning ON the low side transistor LSx to the higher load current (same higher load current as for waveforms 303, 305, and 307 of FIG. 3). As can be seen, the turn-ON delay DLY3 for the low side transistor at the higher load current is smaller than the corresponding turn-on delay DLY2 of FIG. 3.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References herein to a MOSFET being "ON" means that the conduction channel of the MOSFET is present and drain current may flow through the MOSFET. References herein to a MOSFET being "OFF" means that the conduction channel is not present and drain current does not flow through the MOSFET. An "OFF" MOSFET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter, or, if the parameter is zero, a reasonable range of values around zero.

Modifications are possible in the described embodiments, and other embodiments are possible, within the scope of the claims.

What is claimed is:
1. A gate driver, comprising:
 a gate current circuit having an output, the gate current circuit including:
  a capacitor;
  a first current source coupled to the gate current circuit output; and
  a second current source coupled to the gate current circuit output;
  a third current source coupled to the capacitor;
  a fourth current source coupled to the capacitor;
 a driver logic circuit coupled to the gate current circuit,
  a first comparator having a first input and a second input wherein the first input is coupled to the output of the gate current circuit and the second input is coupled to the capacitor; and
 a second comparator having a first input, a second input and an output;
 a first logic gate having an input coupled to the output of the second comparator and having an output;
 a second logic gate having an input coupled to the output of the second comparator and having an output;

a first switch having a control input coupled to the output of the first logic gate; and
a second switch having a control input coupled to the output of the second logic gate.

2. The gate driver of claim 1, wherein:
the first current source is configured to provide the first current at a first magnitude;
the second current source is configured to provide the second current at a second magnitude; and
the first magnitude is greater than the second magnitude.

3. The gate driver of claim 1, further including a delay circuit having an input and an output, the input coupled to an input of the gate driver, and the output coupled to the input of the first logic gate and the input of the second logic gate.

4. A gate driver, comprising:
a first comparator having a first input, a second input, and an output;
a first logic gate having an input coupled to the output of the first comparator and an output;
a second logic gate having an input coupled to the input of the first logic gate and an output;
a first current source having an output, the first current source configured to provide a first current at the output of the first current source in response to an assertion of the first logic gate at the output of the first logic gate;
a second current source having an output coupled to the output of the first current source, the second current source configured to provide a second current at the output of the first current source in response to an assertion of the second logic gate at the output of the second logic gate;
wherein the first logic gate has a second input and the second logic gate has a second input, the gate driver further comprising:
a second comparator having a first input, a second input, and an output, the first input of the second comparator coupled to the output of the first current source, and the output of the second comparator coupled to the second input of the first logic gate and the second input of the first logic gate;
a capacitor;
a third current source configured to at least partially charge the capacitor; and
a fourth current source configured to at least partially discharge the capacitor.

5. The gate driver of claim 4 wherein the capacitor is coupled to the second input of the second comparator.

6. The gate driver of claim 4, wherein the third and fourth current sources are configured to at least partially charge and discharge, respectively, the capacitor to a voltage that is approximately equal to a Miller voltage.

7. The gate driver of claim 4, further comprising
a first switch coupled to the third current source, the first switch having a control input;
a second switch coupled to the fourth current source, the second switch having a control input;
a third logic gate having a first input, a second input, and an output, the first input of the third logic gate coupled to the second input of the first logic gate, the second input of the third logic gate coupled to the first comparator output, and the output of the third logic gate coupled to the control input of the first switch; and
a fourth logic gate having a first input, a second input, and an output, the first input coupled to the second input of the first logic gate, the second input coupled to the output of the first comparator, and the output coupled to the control input of the second switch.

8. The gate driver of claim 7, further including a delay circuit having input and an output, the input coupled to the second input of the first logic gate.

9. The gate driver of claim 8, wherein:
the third logic gate has a third input coupled to the delay circuit output; and
the fourth logic gate has a third input coupled to the delay circuit output.

10. The gate driver of claim 4, wherein the first current source is configured to provide the first current at a greater level than the second current source is configured to provide the second current.

* * * * *